(12) United States Patent
Yoon et al.

(10) Patent No.: US 7,820,073 B2
(45) Date of Patent: Oct. 26, 2010

(54) WHITE LIGHT EMITTING DEVICE

(75) Inventors: Chul Soo Yoon, Gyunggi-Do (KR); Jong Rak Sohn, Gyunggi-Do (KR); Il Woo Park, Gyunggi-Do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 813 days.

(21) Appl. No.: 11/709,155

(22) Filed: Feb. 22, 2007

(65) Prior Publication Data

US 2007/0194695 A1 Aug. 23, 2007

(30) Foreign Application Priority Data

Feb. 22, 2006 (KR) .................. 10-2006-0017440

(51) Int. Cl.
*H01L 33/00* (2010.01)
(52) U.S. Cl. .................. 252/301.4 R; 252/301.4 S; 252/301.6 S; 252/301.4 F; 252/301.4 P; 313/503; 313/498; 257/98; 349/71; 362/97.2; 362/97.3
(58) Field of Classification Search .................. 313/503; 257/98; 252/301.4 R, 301.6 S, 301.4 S, 301.4 F, 252/301.4 P; 349/71; 362/97.2, 97.3
See application file for complete search history.

(56) References Cited

U.S. PATENT DOCUMENTS

| | | | | |
|---|---|---|---|---|
| 3,639,254 | A * | 2/1972 | Peters | 252/301.4 S |
| 6,657,379 | B2 * | 12/2003 | Ellens et al. | 313/503 |
| 7,544,310 | B2 * | 6/2009 | Hirosaki | 252/301.4 F |
| 2004/0090180 | A1 | 5/2004 | Shimizu et al. | |
| 2004/0155225 | A1 * | 8/2004 | Yamada et al. | 252/301.4 R |
| 2005/0046334 | A1 * | 3/2005 | Fujiwara | 313/498 |
| 2005/0205845 | A1 * | 9/2005 | Delsing et al. | 252/301.4 R |
| 2005/0224828 | A1 * | 10/2005 | Oon et al. | 257/99 |
| 2006/0006396 | A1 * | 1/2006 | Chua et al. | 257/79 |
| 2006/0028122 | A1 | 2/2006 | Wang et al. | |
| 2006/0082288 | A1 * | 4/2006 | Menkara et al. | 313/503 |
| 2006/0226772 | A1 * | 10/2006 | Tan et al. | 313/512 |
| 2007/0029526 | A1 * | 2/2007 | Cheng et al. | 252/301.4 F |

FOREIGN PATENT DOCUMENTS

| | | |
|---|---|---|
| JP | 09-218149 A | 8/1997 |
| JP | 10-163535 A | 6/1998 |
| JP | 2002-000363 A | 1/2002 |
| JP | 2005-255895 A | 9/2005 |
| KR | 10-2005-0029795 | 3/2005 |
| WO | WO 2005/087896 * | 9/2005 |
| WO | WO 2005/098972 * | 10/2005 |
| WO | WO 2006/016711 A1 | 2/2006 |

OTHER PUBLICATIONS

Chinese Office Action, with English translation, issued in Chinese Patent Application No. 200710079928.3, mailed Feb. 20, 2009.
Xie, R-J, et al., "$Eu^{2+}$-doped Ca-α-SiAlON: A yellow phosphor for white light-emitting diodes", Applied Physics Letters, Jun. 28, 2004, pp. 5404-5406, vol. 84 No. 26, American Institutes of Physics.
Chinese Office Action, w/ English translation thereof, issued in Patent Application No. CN 2007100799283 dated on Aug. 15, 2008.
Notice of Office Action dated May 25, 2010, issued in counterpart Japanese Application No. 2007-041161.

* cited by examiner

*Primary Examiner*—C. Melissa Koslow
(74) *Attorney, Agent, or Firm*—Sughrue Mion, PLLC

(57) ABSTRACT

A white light emitting device capable of expanding the wavelength range of a blue LED used for realizing white light. The white light emitting device according to the present invention includes a blue LED and a mixture of orange phosphor and green phosphor disposed above the blue LED.

19 Claims, 3 Drawing Sheets

WHITE LIGHT EMITTING DEVICE

CLAIM OF PRIORITY

This application claims the benefit of Korean Patent Application No. 10-2006-0017440 filed on Feb. 22, 2006, in the Korean Intellectual Property Office, the disclosure of which is incorporated herein by reference.

BACKGROUND OF THE INVENTION

1. Field of the Invention

The present invention relates to a white light emitting device using a Light Emitting Diode (LED) and, more particularly, to a white light emitting device which can significantly expand a range of the peak wavelength of an applicable LED by using a combination of orange phosphor and green phosphor.

2. Description of the Related Art

Recently, a white Light Emitting Diode (LED) device is extensively used as a backlight of a liquid crystal display device in replacement of a conventional small-sized lamp or fluorescent lamp. Typically, a white LED device is realized by a combination of a blue LED and yellow phosphor. The phosphor is excited by the blue light emitted from the LED, and thereby emits yellow light. The color combination of the blue light and the yellow light is perceived as white light by an observer. In this case, YAG:Ce and TAG:Ce phosphors, which are garnet crystals of YAG and TAG activated by $Ce^{3+}$, are typically used for the yellow phosphor. In addition, $Eu^{2+}$-activated silicate phosphor is widely used for the yellow phosphor for the white LED device, including for example, phosphors having compositions expressed by formulae: $(2-x-y)SrO.x(Ba,Ca)O.(1-a-b-c-d)SiO_2.aP_2O_5bAl_2O_3.cB_2O_3.dGeO_2:yEu^{2+}$, where $0<x<1.6$, $0.005<y<0.5$, and $0<a, b, c, d<0.5$ and $(3-x)SrO.SiO_2:xEu^{2+}$, where $0<x<1$. These phosphors are excited by the blue light to emit yellow light with relatively high quantum efficiency.

Each of the aforementioned yellow phosphors has a peculiar yellow peak wavelength. Therefore, in order to obtain white light in a region of x=0.27 to 0.33, y=0.25 to 0.35 in the 1931 CIE chromaticity coordinates, which correspond to pure, white, the wavelength of the blue LED usable with the yellow phosphor is extremely limited. In order to overcome such drawbacks, there have been suggested methods of substituting Y with Gd or Al with Ga in the YAG:Ce phosphor and substituting Tb with Gd or Al with Ga in the TAG:Ce phosphor, thereby obtaining a short peak wavelength or a long peak wavelength of the phosphor. Also, in the case of a silicate phosphor, Sr, Ca and Ba can be substituted with each other to induce the wavelength change of the silicate yellow phosphor.

However, the shift range of the wavelength by adjusting the composition as described above is limited. Moreover, as the wavelength change in the phosphor results in degraded light emission efficiency in a corresponding wavelength region, the possible shift range of the wavelength in practice is further limited. In addition, in the case of using the conventional Garnet-based or silicate-based yellow phosphors, the shift range of the yellow light emission wavelength is very small, thus limiting the light emission wavelength of the blue LED used together to realize white light. This in turn hinders realization of high quality white light.

SUMMARY OF THE INVENTION

The present invention has been made to solve the foregoing problems of the prior art and therefore an aspect of the present invention is to provide a white light emitting device which can significantly expand a range of the peak wavelength of a blue LED used for realizing white light.

According to an aspect of the invention, the invention provides a white light emitting device including: a blue light emitting diode; and a mixture of orange phosphor and green phosphor disposed above the blue-light emitting diode.

Preferably, the white light emitting device further includes an encapsulant for encapsulating the blue light emitting diode, wherein the mixture of the orange phosphor and the green phosphor is dispersed in the encapsulant.

According to the present invention, the selection range of the peak wavelength of an applicable blue LED can be expanded to a range of 420 to 480 nm. Preferably, the orange phosphor has an emission peak of 560 to 590 nm. Preferably, the green phosphor has an emission peak of 510 to 550 nm.

According to an embodiment of the present invention, the orange phosphor may be a silicate phosphor having a composition expressed by a following formula: $(3-x-y)SrO.x(Ba,Ca)O.(1-a-b-c-d)SiO_2.aP_2O_5bAl_2O_3.cB_2O_3.dGeO_2:yEu^{2+}$, where $0\leq x<2.4$, $0.005<y<0.5$ and $0\leq a, b, c, d<0.5$.

According to an embodiment of the present invention, the orange phosphor may be a phosphor having a composition expressed by a following formula: $Zn_{1-x}Se_yS_{1-y}:Cu_x$, where $0<x<0.2$ and $0.005<y<1$.

According to an embodiment of the present invention, the orange phosphor may be a Ca-α sialon phosphor having a composition expressed by a following formula: $Ca_xSi_{12-(z+w)}Al_{z+w}O_wN_{16-w}:Eu_y^{2+}$, where $0.5<x<0.9$, $0.01<y<0.15$, $0<z<4$, $0<w<4$ and $0<z+w<4$.

According to an embodiment of the present invention, the orange phosphor may include at least two phosphors selected from the group consisting of phosphors having compositions expressed by following formulae: $(3-x-y)SrO.x(Ba,Ca)O.(1-a-b-c-d)SiO_2.aP_2O_5bAl_2O_3.cB_2O_3.dGeO_2:yEu^{2+}$, where $0\leq x<2.4$, $0.005<y<0.5$ and $0\leq a, b, c, d<0.5$; $Zn_{1-x}Se_yS_{1-y}:Cu_x$, where $0<x<0.2$ and $0.005<y<1$; and $Ca_xSi_{12-(z+w)}Al_{z+w}O_wN_{16-w}:Eu_y^{2+}$, where $0.5<x<0.9$, $0.01<y<0.15$, $0<z<4$, $0<w<4$ and $0<z+w<4$.

According to an embodiment of the present invention, the green phosphor may be a phosphor having a composition expressed by a following formula: $(Sr_{1-x-y}, Ca_x)Ga_2(S_z, Se_{1-z})_4:Eu_y^{2+}$, where $0\leq x<1$, $0<y<0.2$, $0<x+y\leq 1$ and $0<z\leq 1$.

According to an embodiment of the present invention, the green phosphor may be a phosphor having a composition expressed by a following formula: $(Sr_{1-x-y-z},Ca_x,Ba_y,Mg_z)_2SiO_4:Eu_w^{2+}$, where $0<x<1$, $0.5<y<1$, $0<z<1$, $0.03<w<0.2$, and $0<x+y+z+w<1$.

According to an embodiment of the present invention, the green phosphor may be a .beta.-sialon phosphor activated by Eu. In addition, according to an embodiment of the present invention, the green phosphor may be a phosphor selected from the group consisting of phosphors having compositions expressed by following formulae: $Y_3(Al_{1-x},Ga_x)_5O_{12}:Ce$, where $0<x\leq 1$; $SrSi_2O_2N_2:Eu$; $Ca_3Sc_2Si_3O_{12}:Ce$; $CaSc_2O_4:Eu$; and combinations thereof.

According to an embodiment of the present invention, the green phosphor may include at least two phosphors selected from the group consisting of phosphors having compositions expressed by following formulae: $(Sr_{1-x-y},Ca_x)Ga_2(S_z, Se_{1-z})_4:Eu_y^{2+}$, where $0\leq x<1$, $0<y<0.2$, $0<x+y\leq 1$ and $0<z\leq 1$; $(Sr_{1-x-y-z},Ca_x,Ba_y, Mg_z)_2SiO_4:Eu_w^{2+}$, where $0<x<1$, $0.5<y<1$, $0<z<1$, $0.03<w<0.2$ and $0<x+y+z+w<1$; Eu-activated β-sialon; $Y_3(Al_{1-x},Ga_x)_5O_{12}:Ce$, where $0<x\leq 1$; $SrSi_2O_2N_2:Eu$; $Ca_3Sc_2Si_3O_{12}:Ce$; and $CaSc_2O_4:Eu$.

According to an embodiment of the present invention, the orange phosphor may be $Zn(Se_{0.1}, S_{0.9}):Cu$ and the green phosphor may be Eu-activated β-sialon. According to another embodiment of the present invention, the orange phosphor may be $Sr_3SiO_5$:Eu and the green phosphor may be $SrGa_2S_4$:Eu. According to further another embodiment of the present invention, the orange phosphor may be $Zn(Se_{0.1}S_{0.9})$:Cu and the green phosphor may be $CaGa_2(S,Se)_4$:Eu.

According to the present invention, white light is realized using a mixture of orange phosphor and green phosphor in combination with a blue LED. The types and mixing ratio of the two phosphors (orange and green) can be adjusted to significantly expand the peak wavelength range of the phosphor. Therefore, the selection range of the peak wavelength of the blue LED applicable for achieving white light can be significantly expanded to a range of 420 to 480 nm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
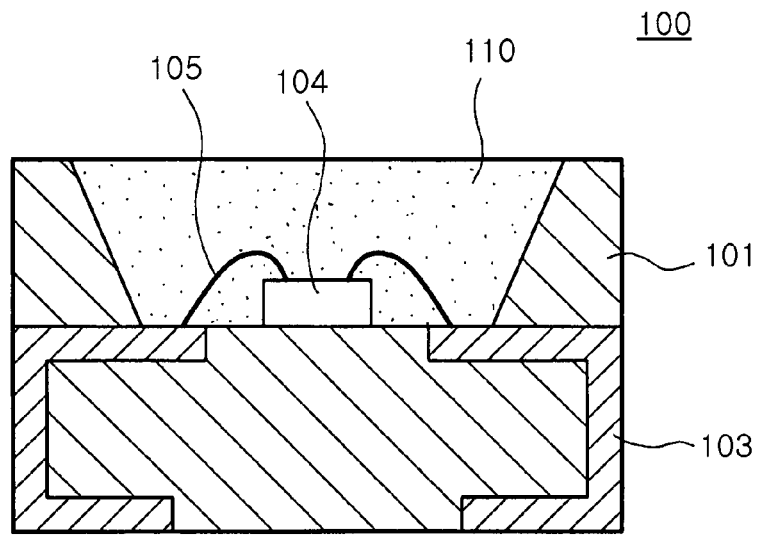
FIG. 1 is a side sectional view illustrating a white light emitting device according to an embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

FIG. 1 is a side sectional view illustrating a white light emitting device according to an embodiment of the present invention. Referring to FIG. 1, the white light emitting device 100 has a blue LED 104 disposed in a recess (or a reflecting cup) of a casing 101. The casing 101 has terminal electrodes 103 formed thereon, which are electrically connected to the LED 104 by bonding wires 105. An encapsulant 110 is formed over the blue LED 104 to encapsulate the blue LED 104. In the encapsulant 110, orange phosphor and green phosphor are dispersed at an appropriate mixing ratio.

As described above, the white light emitting device 100 uses a mixture of orange and green phosphors for wavelength conversion. The types and the mixing ratio of the orange and green phosphors can be suitably selected and determined to adjust the peak wavelength of the light emission spectrum of the phosphor mixture in a range from orange in the vicinity of 580 nm to green in the vicinity of 510 nm. Thereby, the selection range of the peak wavelength of the blue LED 104 used for realizing white light can be significantly expanded to a range of 420 nm to 480 nm. That is, the blue LED 104 of the white light emitting device 100 can be selected from various blue LEDs having a peak wavelength from 420 nm to 480 nm. As a result, the selection range of the blue LED 104 usable for realizing white light can be expanded, facilitating obtainment of high quality white light with good chromaticity coordinate characteristics.

The orange phosphor may adopt a silicate phosphor having a composition expressed by a following formula: $(3-x-y)SrO \cdot x(Ba,Ca)O \cdot (1-a-b-c-d)SiO_2 \cdot aP_2O_5 \cdot bAl_2O_3 \cdot cB_2O_3 \cdot dGeO_2:yEu^{2+}$, where $0 \leq x < 2.4$, $0.005 < y < 0.5$ and $0 \leq a, b, c, d < 0.5$. For example, $Sr_3SiO_5$:Eu can be used for the orange phosphor. In addition, the orange phosphor can adopt a phosphor having a composition expressed by a following formula: $Zn_{1-x}Se_yS_{1-y}:Cu_x$, where $0 < x < 0.2$ and $0.005 < y < 1$. For example, $Zn(Se_{0.1}S_{0.9})$:Cu can be used. In addition, the orange phosphor can adopt a Ca-α sialon phosphor having a composition expressed by a following formula: $Ca_xSi_{12-(z+w)}Al_{z+w}O_wN_{16-w}:Eu_y^{2+}$, where $0.5 < x < 0.9$, $0.01 < y < 0.15$, $0 < z < 4$, $0 < w < 4$ and $0 < z+w < 4$. In addition, the orange phosphor can include a phosphor mixture of at least two selected from the phosphors having the aforementioned composition formulae. The orange phosphors with the above composition formulae are excited by the blue light to exhibit peak light emission wavelengths in the range of 560 to 590 nm.

The green phosphor may adopt a phosphor having a composition expressed by a following formula: $(Sr_{1-x-y},Ca_x)Ga_2(S_z,Se_{1-z})_4:Eu_y^{2+}$ where $0.1 \leq x < 1$, $0 < y < 0.2$, $0 < x+y \leq 1$ and $0 < z \leq 1$. For example, $SrGa_2S_4$:Eu or $CaGa_2(S,Se)_4$:Eu can be used for the green phosphor. Also, the green phosphor can adopt a phosphor having a composition expressed by a following formula: $(Sr_{1-x-y-z},Ca_x,Ba_y,Mg_z)_2SiO_4:Eu_w^{2+}$, where $0 < x < 1$, $0.5 < y < 1$, $0 < z < 1$, $0.03 < w < 0.2$, and $0 < x+y+z+w < 1$. In addition, the green phosphor may adopt Eu-activated β-sialon phosphor, $Y_3(Al_{1-x},Ga_x)_5O_{12}$:Ce, where $0 < x \leq 1$, $SrSi_2O_2N_2$:Eu, $Ca_3Sc_2Si_3O_{12}$:Ce or $CaSc_2O_4$:Eu. In addition, the green phosphor may include a phosphor mixture of at least two selected from the phosphors having the aforementioned composition formulae. The green phosphors having the above composition formulae are excited by the blue light to exhibit light emission peaks in the range of 510 to 550 nm.

Figure 2:
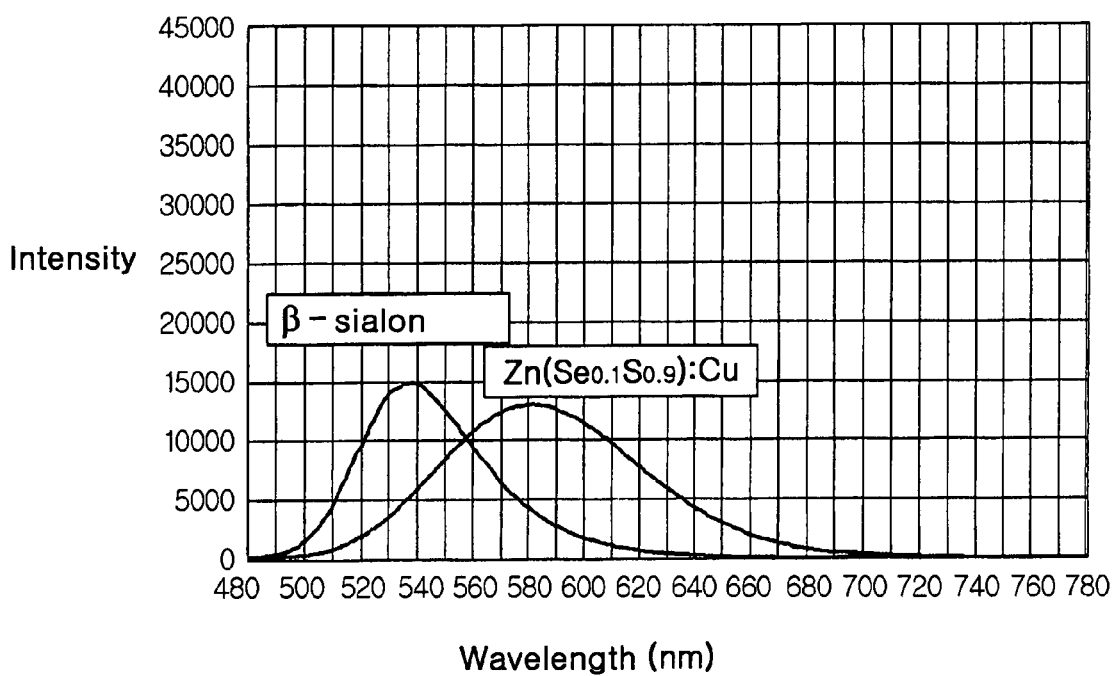
FIG. 2 is a graph showing the light emission spectrums of ZnSeS:Cu phosphor and β-sialon phosphor.

FIG. 2 is a graph illustrating the light emission spectrums of the orange phosphor and the green phosphor applicable to the present invention. In particular, FIG. 2 shows the light emission spectrum of '$Zn(Se_{0.1},S_{0.9})$:Cu', which is orange phosphor, and the light emission spectrum of 'Eu-doped β-sialon', which is green phosphor. $Zn(Se_{0.1},S_{0.9})$:Cu is excited by the blue light of 420 to 480 nm to emit orange light having a peak wavelength in the vicinity of 580 nm. That is, $Zn(Se_{0.1},S_{0.9})$:Cu can be adopted as the orange phosphor of the present invention. The Eu-doped β-sialon is excited by the blue light of 420 to 480 nm to emit green light having a peak wavelength in the vicinity of 540 nm.

As described above, the orange phosphor and the green phosphor can be mixed and used as a phosphor mixture for the white light emitting device. The mixing ratio of the orange phosphor and the green phosphor can be selected as desired to adjust the peak wavelength of the light emission spectrum of the phosphor mixture in a range from orange in the vicinity of 580 nm to green in the vicinity of 540 nm.

Figure 3:
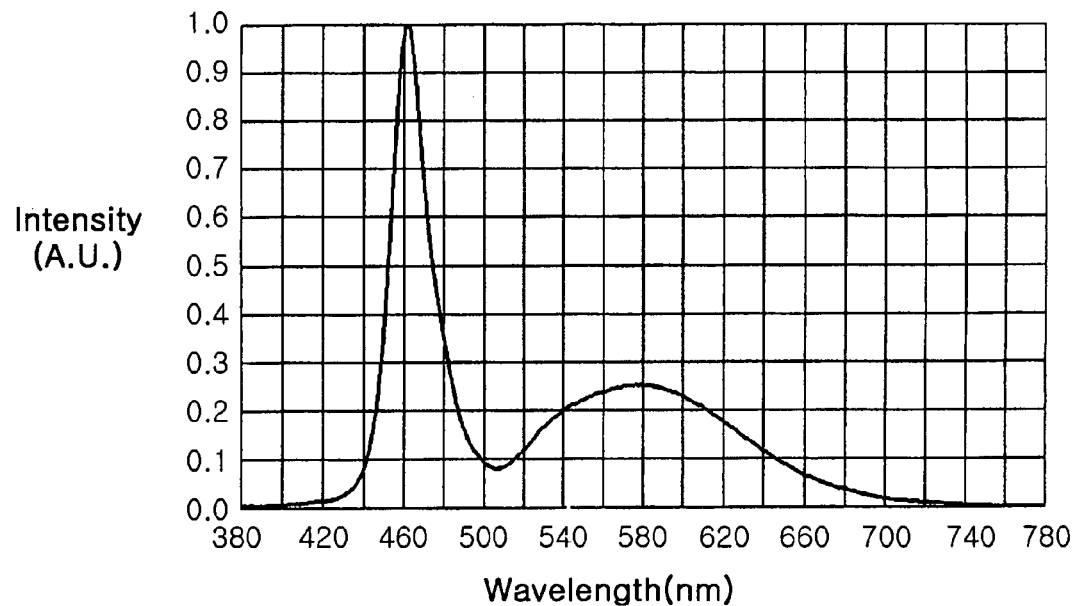
FIG. 3 is a graph illustrating the light emission spectrum of the white light emitting device according to an embodiment of the present invention.

FIG. 3 is a graph showing the light emission spectrum of the white light emitting device according to an embodiment of the present invention. The light emission spectrum of FIG. 3 is obtained by applying the mixture of the orange phosphor 'Zn(Se$_{0.1}$,S$_{0.9}$):Cu' and the green phosphor 'Eu-doped β-sialon' shown in FIG. 2 to a blue LED having a peak wavelength of 460 nm. As shown in FIG. 3, the light emission spectrum of the white light emitting device has peaks in the vicinity of 460 nm and in the vicinity of 580 nm and is distributed over a relatively wide wavelength range. Combination of such a phosphor mixture and a blue LED results in white light having good chromaticity coordinate characteristics.

Figure 4:
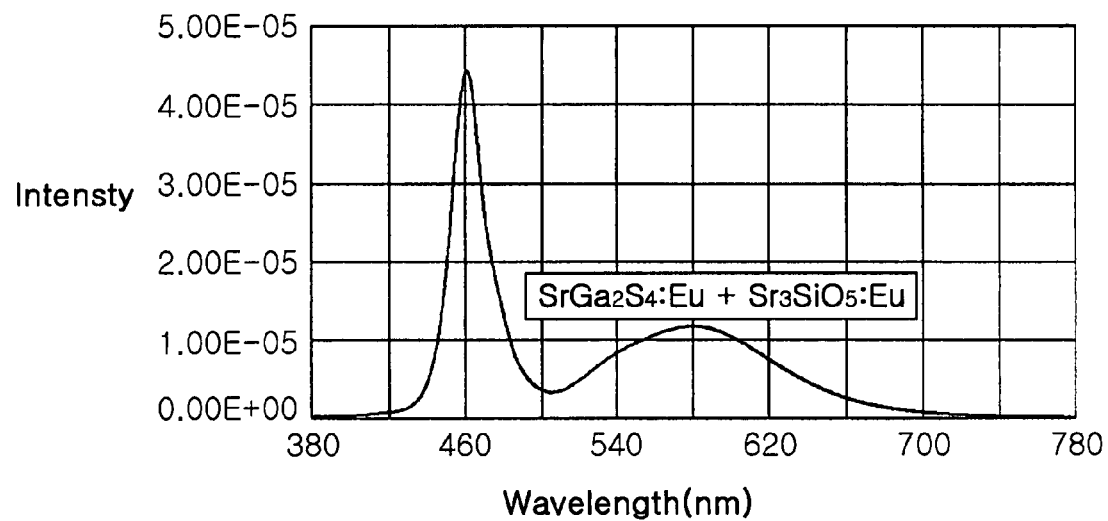
FIG. 4 is a graph showing the light emission spectrum of a white light emitting device according to another embodiment of the present invention.

FIG. 4 is a graph illustrating the light emission spectrum of a white light emitting device according to another embodiment of the present invention. The light emission spectrum of FIG. 4 is obtained by applying a phosphor mixture of the orange phosphor Sr$_3$SiO$_5$:Eu and the green phosphor SrGa2S4:Eu to a blue LED having a peak wavelength of 460 nm. As shown in FIG. 4, the light emission spectrum of the white light emitting device has peaks in the vicinity of 460 nm and in the vicinity of 580 nm and is distributed over a relatively wide wavelength range. Combination of such a phosphor mixture and a blue LED results in white light with good chromaticity coordinate characteristics. The mixing ratio of the orange phosphor Sr$_3$SiO$_5$:Eu and the green phosphor SrGa2S4:Eu can be adjusted according to the wavelength range of the usable blue LED.

Figure 5:
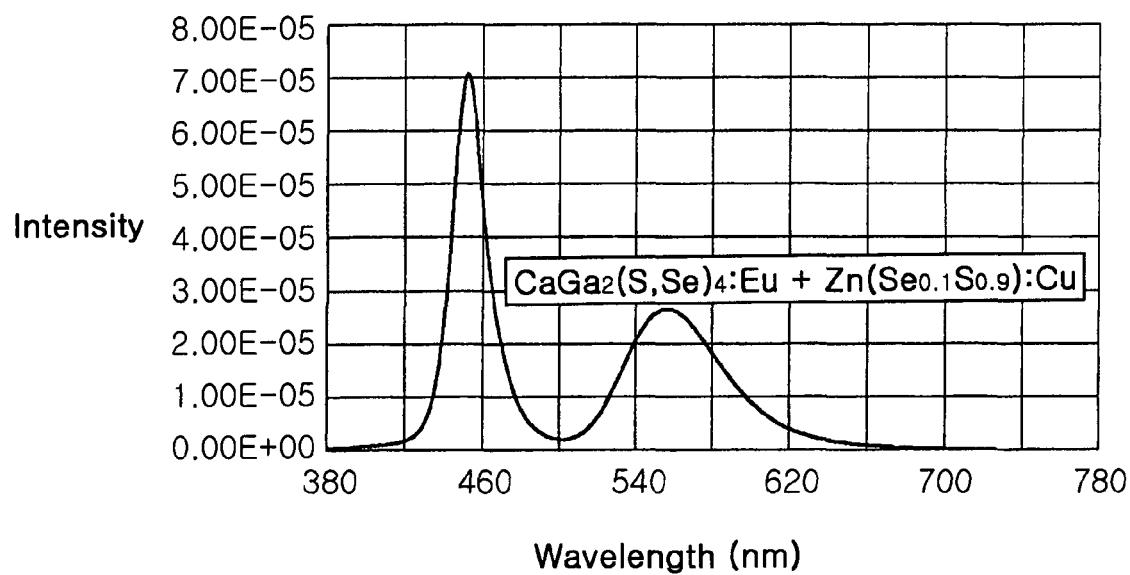
FIG. 5 is a graph showing the light emission spectrum of a white light emitting device according to further another embodiment of the present invention.

FIG. 5 is a graph showing the light emission spectrum of a white light emitting device according to further another embodiment of the present invention. The light emission spectrum of FIG. 5 is obtained by applying a phosphor mixture of the orange phosphor Zn(Se$_{0.1}$S$_{0.9}$):Cu and the green phosphor CaGa$_2$(S,Se)$_4$: Eu to a blue LED having a peak wavelength of 452 nm. As shown in FIG. 5, the light emission spectrum of the white light emitting device has peaks in the vicinity of 450 nm and in the vicinity of 555 nm and is distributed over a relatively wide wavelength range. The light emission spectrum obtained in this embodiment indicates white light with good color coordinate characteristics. The mixing ratio of the orange phosphor Zn(Se$_{0.1}$S$_{0.9}$):Cu and the green phosphor CaGa$_2$(S,Se)$_4$:Eu can be adjusted according to the wavelength range of the blue LED.

Exemplary embodiments of a white light emitting device using a phosphor mixture according to the present invention have been explained herein with reference to FIGS. 3 to 5, but the present invention is not limited thereto. In addition, the mixing ratio of the orange phosphor and the green phosphor can be varied to easily adjust the peak wavelength of a blue LED with the chromaticity coordinates, x=0.27 to 0.33 and y=0.25 to 0.35. This allows a wider selection range of the blue LED applicable to the white light emitting device.

According to the present invention as set forth above, orange phosphor and green phosphor can be applied to a blue LED to easily adjust the peak wavelength of a phosphor mixture. Thereby, the selection range of the peak wavelength of the blue LED adopted to realize white light with good chromaticity coordinate characteristics is significantly expanded to a range of 420 nm to 480 nm. This ultimately allows achieving high quality white light.

While the present invention has been shown and described in connection with the exemplary embodiments, it will be apparent to those skilled in the art that modifications and variations can be made without departing from the spirit and scope of the invention as defined by the appended claims.

What is claimed is:

1. A backlight of a liquid crystal display device having a white light emitting device,
   wherein the white light emitting device comprises:
      a light emitting diode having an emission peak in a range of 420 to 460 nm; and
      a mixture of a first phosphor having an emission peak in a range of 560 to 590 nm and a second phosphor having an emission peak in a range of 510 to 550 nm disposed above the light emitting diode,
   the second phosphor comprising at least one phosphor selected from the group consisting of phosphors having compositions expressed by the following formulae:
      —(Sr$_{1-x-y-z}$,Ca$_x$,Ba$_y$,Mg$_z$)$_2$SiO$_4$:EU$_w^{2+}$ where 0<x<1, 0.5<y<1, 0<z<1, 0.03<w<0.2 and 0<x+y+z+w<1;
      Y$_3$(Al$_{1-x}$,Ga$_x$)$_5$O$_{12}$: Ce, where 0<x≦1; and
      Eu-activated β-sialon; and
   the white light emitting device emits white light in a region of x=0.27 to 0.33, y=0.25 to 0.35 in the 1931 CIE chromaticity coordinates by combination of the light emitting diode and the mixture of the first phosphor and the second phosphor.

2. The backlight of a liquid crystal display device according to claim 1, the white light emitting device further comprising an encapsulant, for encapsulating the light emitting diode, wherein the mixture of the first phosphor and the second phosphor is dispersed in the encapsulant.

3. The backlight of a liquid crystal display device according to claim 1, wherein the first phosphor comprises a silicate phosphor having a composition expressed by a following formula:
   (3-x-y)SrO.x(Ba,Ca)O.(1-a-b-c-d)SiO$_2$.aP$_2$O$_5$ bAl$_2$O$_3$.cB$_2$O$_3$.dGeO$_2$:yEu$^{2+}$,
   where 0≦x<2.4, 0.005<y<0.5 and 0≦a, b, c, d<0.5.

4. The backlight of a liquid crystal display device according to claim 1, wherein the first phosphor comprises a phosphor having a composition expressed by a following formula:
   Zn$_{1-x}$,Se$_y$S$_{1-y}$:Cu$_x$, where 0<x<0.2 and 0.005<y<1.

5. The backlight of a liquid crystal display device according to claim 1, wherein the first phosphor comprises a Ca-α sialon phosphor having a composition expressed by a following formula:
   Ca$_x$; Si$_{12-(z+w)}$Al$_{z+w}$O$_w$N$_{16-w}$:Eu$_y^{2+}$, where 0.5<x<0.9, 0.01<y<0.15, 0<z<4, 0<w<4 and 0<z+w<4.

6. The backlight of a liquid crystal display device according to claim 1, wherein the second phosphor further comprises a phosphor having a composition expressed by a following formula:
   (Sr$_{1-x-y}$,Ca$_x$)Ga$_2$(Sz,Se$_{1-z}$)$_4$:Eu$_y^{2+}$, where 0≦x<1, 0<y<0.2, 0<x+y≦1 and 0<z≦1.

7. The backlight of a liquid crystal display device according to claim 1, wherein the second phosphor comprises a phosphor selected from the group consisting of phosphors having compositions expressed by following formulae:
   SrSi$_2$O$_2$N$_2$:Eu, Ca$_3$Sc$_2$Si$_3$O$_{12}$:Ce, CaSc$_2$O$_4$:Eu and combinations thereof.

8. A white light emitting device comprising:
   a blue light emitting diode; and
   a mixture of orange phosphor and green phosphor disposed above the blue light emitting diode;
   wherein the orange phosphor comprises at least two phosphors selected from the group consisting of phosphors having compositions expressed by following formulae:
   (3-x-y)SrO.x(Ba,Ca)O.(1-a-b-c-d)SiO$_2$.aP$_2$O$_5$ bAl$_2$O$_3$.cB$_2$O$_3$.dGeO$_2$:yEu$^{2+}$, where 0≦x<2.4, 0.005<y<0.5 and 0≦a, b, c, d<0.5;
   Zn$_{1-x}$Se$_y$S$_{1-y}$:Cu$_x$, where 0<x<0.2 and 0.005<y<1; and
   Ca$_x$Si$_{12-(z+w)}$Al$_{z+w}$O$_w$N$_{16-w}$:Eu$_y^{2+}$, where 0.5<x<0.9, 0.01<y<0.15, 0<z<4, 0<w<4 and 0<z+w<4.

9. A white light emitting device comprising:

a blue light emitting diode; and a mixture of orange phosphor and green phosphor disposed above the blue light emitting diode;

wherein the green phosphor comprises a phosphor having a composition expressed by a following formula:

—$(Sr_{1-x-y-z},Ca_x,Mg_z)_2SiO_4:Eu_w^{2+}$ where $0<x<1$, $0.5<y<1$, $0<z<1$, $0.03<w<0.2$ and $0<x+y+z+w<1$.

10. A white light emitting device comprising:

a blue light emitting diode; and a mixture of orange phosphor and green phosphor disposed above the blue light emitting diode;

wherein the green phosphor comprises at least two phosphors selected from the group consisting of phosphors having compositions expressed by following formulae:

$(Sr_{1-x-y},Ca_x)Ga_2(S_z,Se_{1-z})_4:Eu_y^{2+}$, where $0\leq x<1$, $0<y<0.2$, $0<x+y\leq 1$ and $0<z\leq 1$;

$(Sr_{1-x-y-z},Ca_x,Ba_y,Mg_z)_2SiO_4:Eu_w^{2+}$, where $0<x<1$, $0.5<y<1$, $0<z<1$, $0.03<w<0.2$ and $0<x+y+z+w<1$;

Eu-activated β-sialon;

$Y_3(Al_{1-x},Ga_x)_5O_{12}:Ce$, where $0<x\leq 1$; $SrSi_2O_2N_2:Eu$;

$CaSc_2Si_3O_{12}:Ce$; and $CaSc_2O_4:Eu$.

11. A white light emitting device comprising:

a blue light emitting diode; and a mixture of orange phosphor and green phosphor disposed above the blue light emitting diode; wherein the orange phosphor comprises $Zn(Se_{0.1},S_{0.9}):Cu$ and the green phosphor comprises Eu-activated β-sialon.

12. A white light emitting device comprising:

a blue light emitting diode; and a mixture of orange phosphor and green phosphor disposed above the blue light emitting diode;

wherein the orange phosphor comprises $Sr_3SiO_5:Eu$ and the green phosphor comprises $SrGa_2S_4:Eu$.

13. A white light emitting device comprising:

a blue light emitting diode; and a mixture of orange phosphor and green phosphor disposed above the blue light emitting diode;

wherein the orange phosphor comprises $Zn(Se_{0.1}S_{0.9}):Cu$ and the green phosphor comprises $CaGa_2(S,Se)_4:Eu$.

14. A display device comprising:

a display panel; and a backlight unit which emits light to the display panel, the backlight unit comprising a while light emitting device, wherein the white light emitting device comprises:

a light emitting diode having an emission peak in a range of 420 to 460 nm; and a mixture of a first phosphor having an emission peak in a range of 560 to 590 nm and a second phosphor having an emission peak in a range of 510 to 550 nm disposed above the light emitting diode, the second phosphor comprising at least one phosphor selected from the group consisting of phosphors having compositions expressed by the following formulae:

$(Sr_{1-x-y-z}Ca_x,Ba_y,Mg_z)_2SiO_4:Eu_w^{2+}$, where $0<x<1$, $0.5<y<1$, $0<z<1$, $0.03<w<0.2$ and $0<x+y+z+w<1$;

$Y_3(Al_{1-x},Ga_x)_5O_{12}:Ce$, where $0<x\leq 1$; and

Eu-activated β-sialon; and the white light emitting device emits white light in a region of x=0.27 to 0.33, y=0.25 to 0.35 in the 1931 CIE chromaticity coordinates by combination of the light emitting diode and the mixture of the first phosphor and the second phosphor.

15. The display device of claim 14 further comprising a driving circuit which drives the backlight unit.

16. The display device of claim 14, wherein the display panel is a liquid crystal panel.

17. A television comprising the display device of claim 14.

18. The television of claim 17 further comprising a driving circuit which drives the backlight unit.

19. The television of claim 17, wherein the display panel is a liquid crystal panel.

* * * * *